(12) United States Patent
Yuan et al.

(10) Patent No.: US 7,099,226 B2
(45) Date of Patent: Aug. 29, 2006

(54) FUNCTIONAL REGISTER DECODING SYSTEM FOR MULTIPLE PLANE OPERATION

(75) Inventors: Yolanda Yuan, Saratoga, CA (US); Jason Guo, San Jose, CA (US); Sai K. Tsang, Union City, CA (US); Vikram Kowshik, Cupertino, CA (US); Steven J. Schumann, Sunnyvale, CA (US)

(73) Assignee: Atmel Corporation, San Jose, CA (US)

( * ) Notice: Subject to any disclaimer, the term of this patent is extended or adjusted under 35 U.S.C. 154(b) by 418 days.

(21) Appl. No.: 10/686,401

(22) Filed: Oct. 14, 2003

(65) Prior Publication Data

US 2005/0099857 A1  May 12, 2005

(51) Int. Cl.
*G11C 8/00* (2006.01)
(52) U.S. Cl. .......................... 365/230.03; 365/230.06; 365/189.04
(58) Field of Classification Search ........... 365/230.03, 365/230.06, 189.04
See application file for complete search history.

(56) References Cited

U.S. PATENT DOCUMENTS

| | | | |
|---|---|---|---|
| 5,841,696 A | 11/1998 | Chen et al. | 365/185.11 |
| 5,867,430 A | 2/1999 | Chen et al. | 365/189.04 |
| 6,026,021 A | 2/2000 | Hoang | 365/185.11 |
| 6,470,414 B1 | 10/2002 | Kuo et al. | 711/103 |
| 6,501,700 B1 | 12/2002 | Pascucci | 365/230.04 |
| 6,560,159 B1 | 5/2003 | Mochida | 365/230.03 |
| 6,757,779 B1 * | 6/2004 | Nataraj et al. | 365/49 |
| 6,831,850 B1 * | 12/2004 | Pereira et al. | 365/189.07 |
| 2002/0196669 A1 | 12/2002 | Hsu et al. | 365/189.04 |

* cited by examiner

*Primary Examiner*—Tuan T. Nguyen
(74) *Attorney, Agent, or Firm*—Schneck & Schneck; Thomas Schneck; Mark Protsik

(57) ABSTRACT

A decoding system for multi-plane memories routes address information corresponding to distinct memory access operations to the designated planes. The system includes an array of functional registers dedicated to random access read, burst read, program, erase, and erase-suspend program operations. Plane selector blocks for each plane receive the address outputs from all of the registers and plane function select logic controls the routing in accord with memory access commands for specified planes. Simultaneous operations of different type in different planes and nested operations in the same plane are possible.

17 Claims, 7 Drawing Sheets

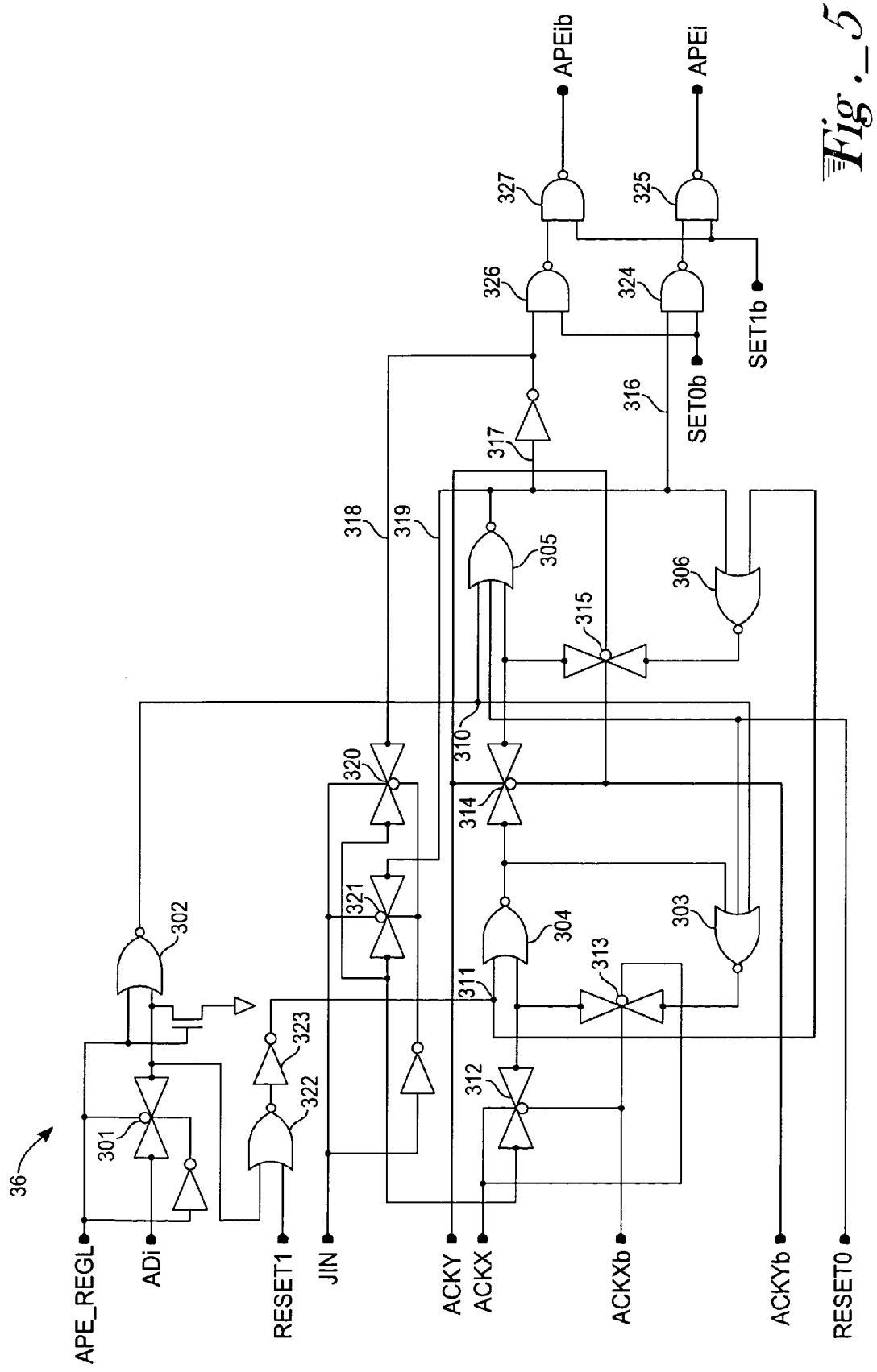
Fig._5

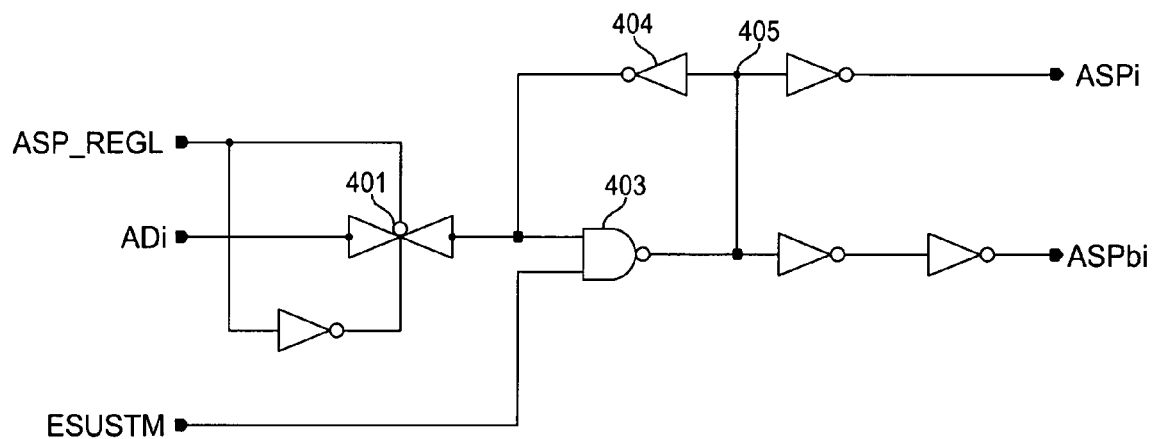
Fig. _6

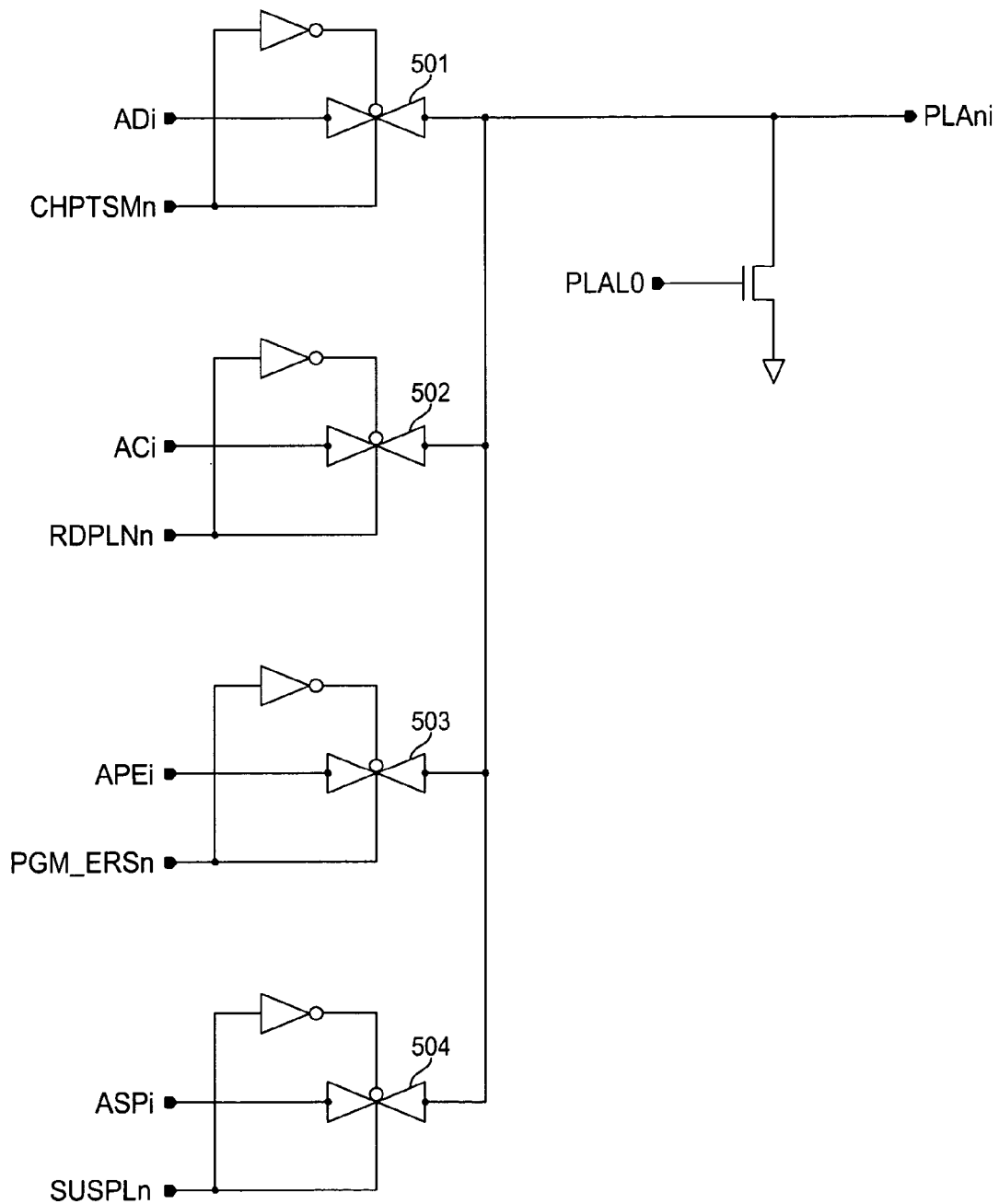
Fig. _7

FUNCTIONAL REGISTER DECODING SYSTEM FOR MULTIPLE PLANE OPERATION

TECHNICAL FIELD

The invention relates to non-volatile flash memory devices of the type having a plural bank or block architecture and capable of simultaneous operations (e.g., read and write). The invention relates in particular to arrangements for addressing such memory devices, including memory block selection and addressing for simultaneous memory operations.

BACKGROUND ART

U.S. Pat. Nos. 5,841,696 and 5,867,430 to Chen et al. describe non-volatile flash memory devices that enable simultaneous read and write operations. The disclosed memory may be organized into at least two banks, each bank including a number of sectors. Each bank shares the X decode logic (including sector decode and wordline decode logic for all banks), but has its own Y decode logic. A plurality of latches are provided which are connected to memory access lines. Virtually simultaneous operations are achieved by time multiplexing the X decode path between read and write operations, using timing signals to latch a first wordline for a first operation and then relinquish the X decode path so that a second operation can load an address and access a second wordline in another bank of the memory.

U.S. Pat. No. 6,501,700 to Pascucci describes an internal addressing structure for semiconductor memories having at least two memory banks. Here, each bank has its own row and column select circuitry. Each bank also includes an associated memory scan and address counter circuit for generating sequences of addressing codes for the corresponding bank. This structure permits sequential accessing of consecutive locations in alternating banks in an interleaved manner that is transparent to the external system.

In memory devices of the type having a plurality of banks or blocks of memory (hereinafter referred to as "planes"), each plane is effectively an independent entity having its own row and column decoders and capable of performing its own function (read, write, etc.) without interference from the other memory planes. Externally, the memory is seen as a single memory unit with a common address space, where one or more of the address bits designates a particular memory plane. Each plane may be further divided into sectors.

It is desirable to provide as much functional flexibility as possible to the memory device. The planes themselves provide some flexibility by allowing different planes to simultaneously carry out different functions. For example, it is possible for programming or erasing operation (both rather time consuming operations) to be performed in one plane, while read access to the other planes remains available. Read operations may be provided in both random access and burst modes.

An object of the present invention is to further enhance the functional flexibility of multi-plane memory devices, by providing for nested operations in the same plane, in addition to a variety of functions in the different planes.

DISCLOSURE OF THE INVENTION

The present invention is directed to decoder circuit arrangements for routing address and counter information stored in functional registers to selected memory planes capable of simultaneous independent operation. The ability to retain multiple kinds of address information for the different memory access functions and to route them as needed to the various planes in accord with received commands allows the memory to perform simultaneous operations in different planes and nesting of operations within the same plane. In the invention, each memory plane is capable of operating in various modes (e.g., random read, burst read, test, program/erase, program-suspend) requiring specified address or counter registers. One plane may operate in one mode, while another plane simultaneously operates in a different unrelated mode. (For example, random read and burst read are different but related operations.)

This system has the capability not merely of concurrent program or erase and random read operations, but can also deal with concurrent program or erase and burst read operations. Furthermore, the system can deal with concurrent operation between program and burst read on different planes, while an erasure in another sector of the plane is in suspension because there is provided a register to store the suspend address during the erasure. Other nested operations in different sectors of the same plane can occur, e.g. with a program operation suspended. From a common input address bus, each register is routed by a selector switching circuit to the appropriate plane. Several operations can be occurring in the same plane in a nested fashion, with one operation in suspension while another intervening operation is executed, and with a read operation (random access or burst) also permitted.

BRIEF DESCRIPTION OF THE DRAWING

FIGS. 3 through 6 are gate-level schematics of functional registers used in the decoding system of FIG. 2.

FIG. 7 is a gate-level schematic of plane selector unit used in the decoding system of FIG. 2 for directing information in the functional registers to selected planes of the memory device.

BEST MODE OF CARRYING OUT THE INVENTION

Figure 1:
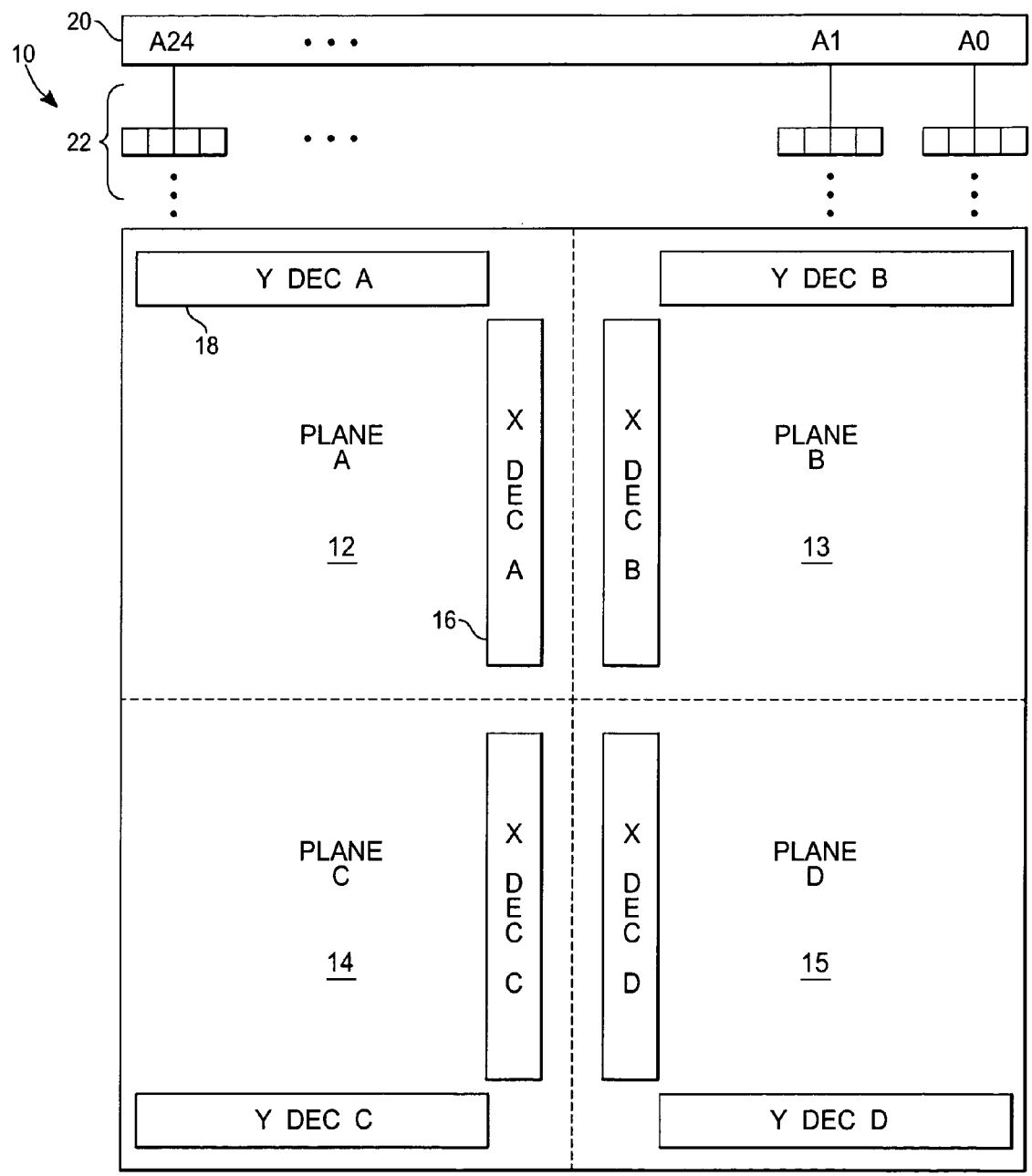
FIG. 1 is a plan schematic of a typical multi-plane memory device in accord with the present invention.

With reference to FIG. 1, a memory device 10 in accord with the present invention, such as a non-volatile flash memory, is organized into multiple planes 12–15, shown here with four planes A–D. These planes are capable of independent operation, as each has its own row 15. (X) decoder 16 and its own column (Y) decoder 18 circuitry. As seen externally by a user, the memory device 10 is a single unit with a common address space. Addresses for accessing the memory planes are received by an input address buffer 20, together with access commands (random access read, burst read, program, erase, suspend, test, etc.) associated with the received address. The function decoding system 22 that interfaces between the common address buffer 20 and the decoders 16 and 18 for the particular planes 12–15 is described as follows with respect to FIGS. 2–7.

Figure 2:
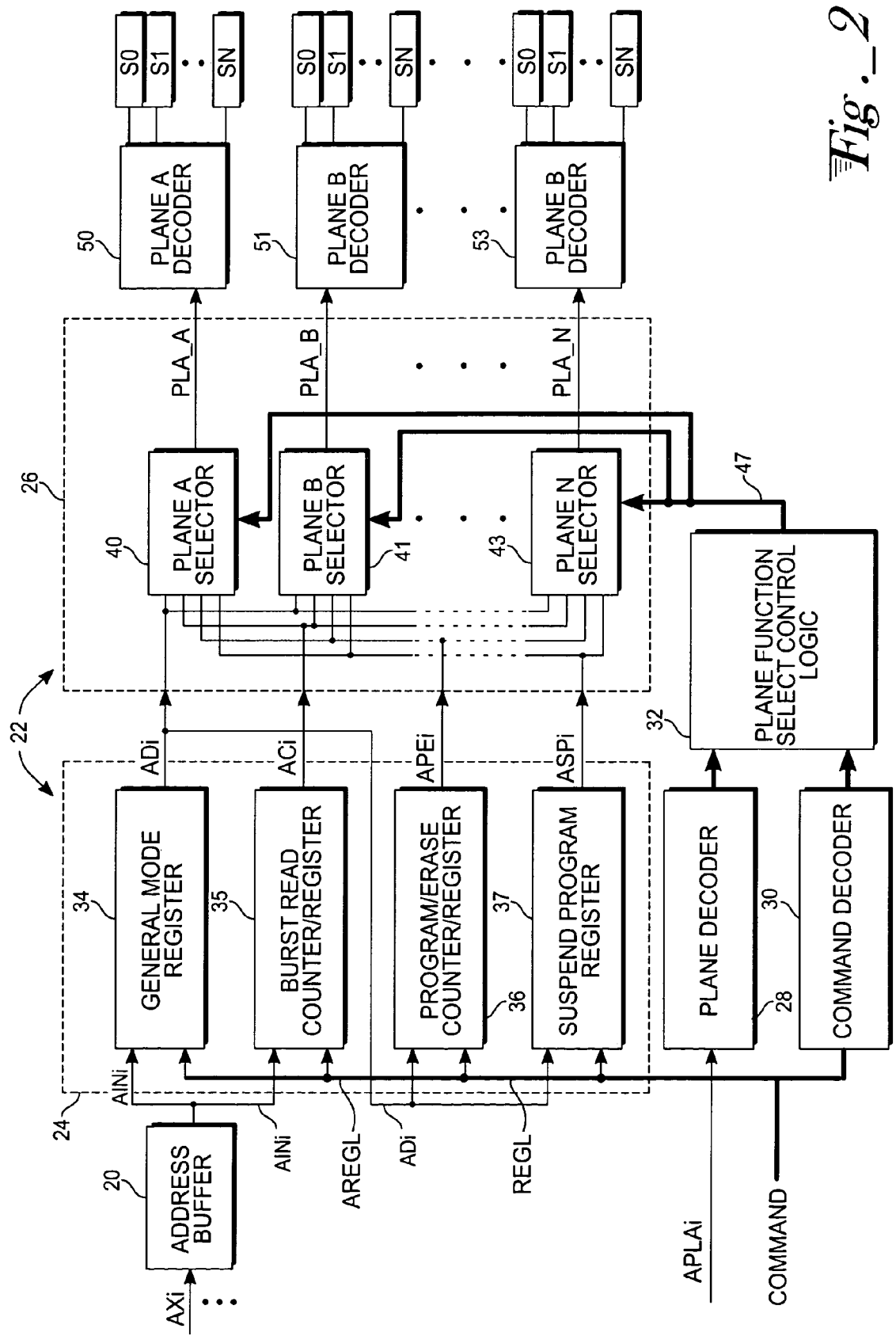
FIG. 2 is schematic block diagram illustrating the functional register decoding system of the present invention for use with the memory device of FIG. 1.

In FIG. 2, the function decoding system 22 includes a register array 24 and a plane selector 26, along with plane address and command decoders 28 and 30 and associated plane function select control logic 32. An external address received by the system 22 includes plane address bits APLAi transmitted to the plane address decoder 28 for designating a particular plane, and other address bits AXi designating a location within the particular plane which are received by the common address buffer 20 and transmitted to the register array 24. The function decoding system 22 also receives COMMAND information for designating a particular type of memory access operation (random access read, burst read, erase, program, program suspend, test, etc.) that corresponds to the received address information, and for locking the registers for the designated operation. The operation command information is directed to the command decoder 30, while the corresponding register lock signals REGL are sent to the register array 24.

The register array 24 includes a plurality of functional counter/registers 34–37, each storing address information for a particular type of memory access operation. The counter/registers 34–37 may be locked by signals REGL from the command bus. To accommodate the needs of concurrent and nested memory operations, a typical register array 24 may include at least the following four functional registers for handling the different memory operations:

General Mode Register 34:

This is a static register that could be used as a general address buffer for random access read operations. It may also serve to address a test mode operation., The general mode register 34 inputs address bits AINi from the address buffer 20 and outputs that address as a general address output ADi to the plane selector 26. It also transfers an address to the program and erase counter/register 36 and to the suspend register 37, as described later.

Burst Read Counter/Register 35:

This register is dedicated for burst read operations and thus serves as an address counter. It can also be used for random read operation when it is not counting. Like the general mode register 34, the burst read counter/register 35 inputs address bits AINi from the address buffer 20 and outputs a series of successive addresses ACi that are generated in the counter/register 35 to the plane selector 26.

Program and Erase Counter/Register 36:

This register is used for both program and erase operations. It maintains the program address bits ADi that it receives from the general mode register 34. It also serves as an address counter during an erase operation. The counter/register output bits APEi are provided to the plane selector 26.

Erase-Suspend Program Register 37:

This register is used only during suspend operations. While an erase operation is suspended by a nested program operation, this register stores the program address that is to be executed. (Meanwhile, the program and erase counter/register 36 holds the suspended erase count.) The suspend register receives the program address bits ADi from the general mode register 34, and outputs them as program address bits ASPi to the plane selector 26.

Details of these registers 34–37 are seen in FIGS. 3–6. Inverters are provided in the circuit where needed to obtain the desired signal polarity.

Figure 3:
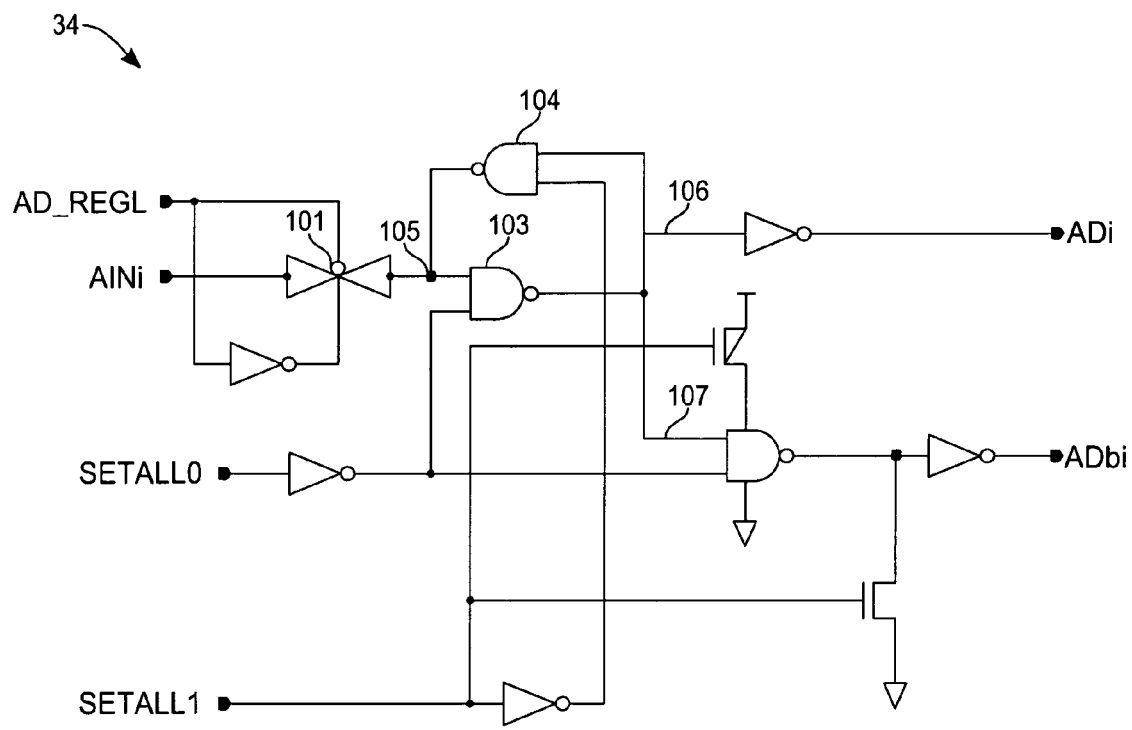

In FIG. 3, the circuitry for one bit of the general mode register 34 is seen. The circuitry for the other bits is identical. The address input bit AINi is gated by a pass gate element 101 controlled by a register lock signal AD_REGL. Whenever the register is unlocked, the input bits will be transferred into the register. Whenever the register is locked, the input bits cannot pass through the pass gate element 101. The other registers 35–37 seen in FIGS. 4–6 are similarly gated by corresponding pass gate elements 201, 301 and 401 controlled by specific register lock signals.

The received input bit AINi is latched by cross-coupled NAND gates 103 and 104 through latch input node 105. A second set of inputs to the latch NAND gates 103 and 104 are fed by SETALL0 and SETALL1 signals, respectively, that (when active) serve to set all of the bits of the general mode register 34 to zero or one. The latch output is fed via lines 106 and 107 to complementary outputs ADi and ADbi.

Figure 4:
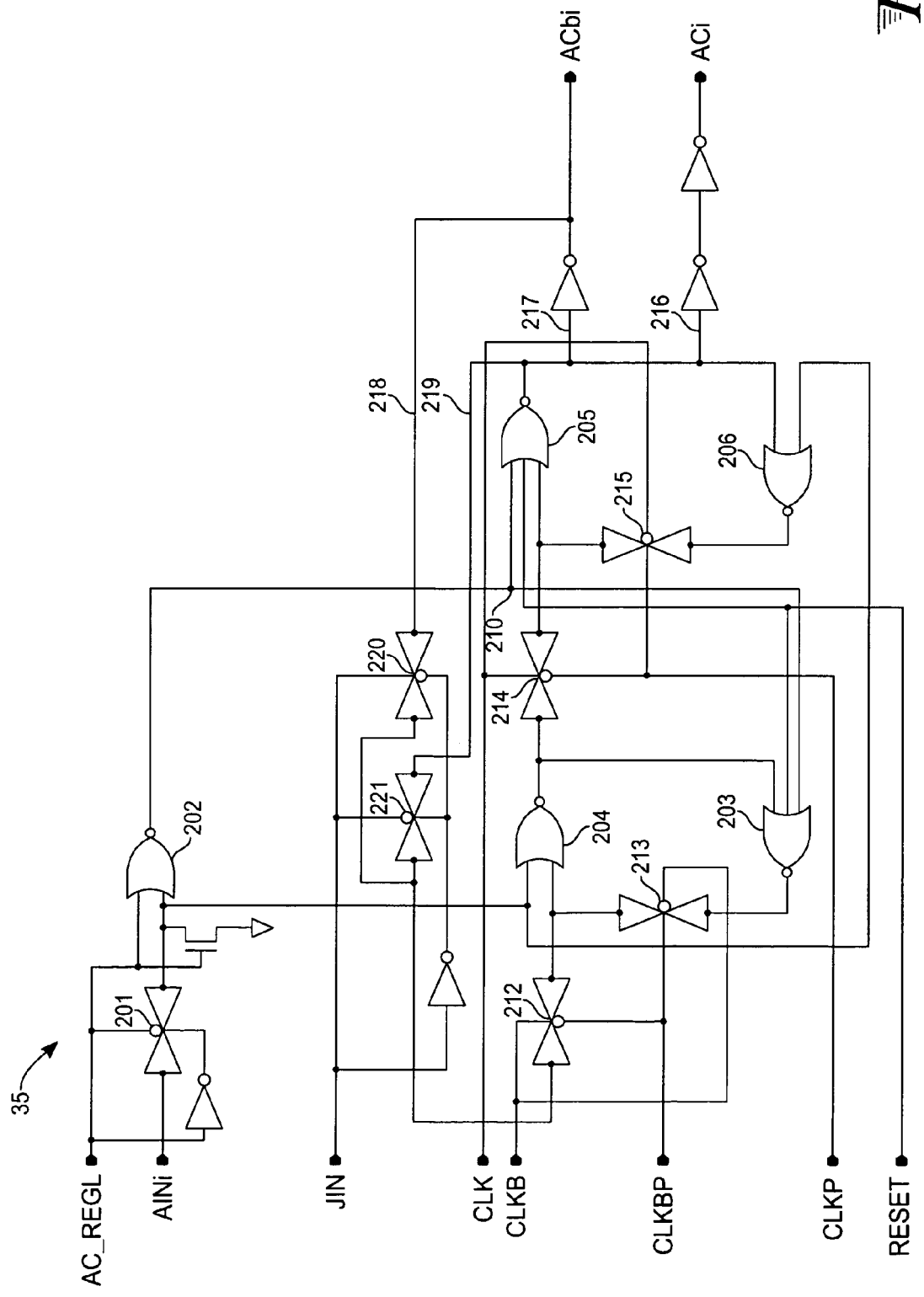

In FIG. 4, the burst read counter/register 35 likewise gates the address input bits AINi through a pass gate element 201 controlled by a register lock signal AC_REGL. The address input bit AINi, after being inverted by NOR gate 202 is supplied to a first master latch circuit made up of cross-coupled NOR gates 203 and 204, and also to a second slave latch circuit made up of cross-coupled NOR gates 205 and 206, at a node 210 between the two latches.

A second set of inputs to the latch NOR gates 203 and 205 are fed by a RESET signal, that (when active) serves to set all of the bits of the burst read counter/register 36 to zero.

The two latches are clocked by pairs of complementary clock signals CLKB and CLKBP (supplied to pass gates 212 and 213 of the first latch) and CLK and CLKP (supplied to pass gates 214 and 215 of the second latch). The pass gates 212 and 214 control the transfer of latched states between the two latches, while the pass gates 213 and 215 enable and temporarily disable the feedback between the cross-coupled NOR gates to assist the latches to receive a different state. The second slave latch output is fed via lines 216 and 217 to complementary outputs ACi and ACbi.

Feedback of the second slave latch circuit along complementary feedback lines 218 and 219 to the first master latch circuit is controlled by an input signal JIN that selects by means of pass gate elements 220 and 221 between the complementary feedbacks. The input signal JIN is obtained from burst read counter outputs ACi of lower bit significance. On each clock, the least significant bit changes between 0 and 1, while all other bits only change state when all of the bits of lower significance are 1's. Thus, the burst read counter/register 35 starts at the address designated by the input bits AINi and count upward by one on each clock.

In FIG. 5, the program and erase counter/register 36 also gates the address input bits ADi through a pass gate element 301 controlled by a register lock signal APE_REGL. The address input bit ADi, after being inverted by NOR gate 302 is supplied to a first master latch circuit made up of cross-coupled NOR gates 303 and 304, and also to a second slave latch circuit made up of cross-coupled NOR gates 305 and 306, at a node 310 between the two latches. The address input bit ADi also is supplied uninverted (actually twice inverted by NOR gate 322 and inverter 323) to the inputs of latch NOR gates 304 and 306 via a second node 311.

A second set of inputs to the latch NOR gates 303 and 305 are fed by a RESET0 signal, that (when active) serves to set all of the bits of the program and erase counter/register 36 to zero. A RESET1 signal is supplied to second node 311, that (when active) serves to set all of the bits of the program and erase counter/register 36 to one. SET0b and SET1b signals are coupled to NAND gates 324–327 on the register output lines to override the output bit states without affecting the stored latch states.

The two latches are clocked by pairs of complementary clock signals ACKX and ACKXb (supplied to pass gates 312 and 313 of the first latch) and ACKY and ACKYb (supplied to pass gates 314 and 315 of the second latch). The pass gates 312 and 314 control the transfer of latched states between the two latches, while pass gates 313 and 315 enable and temporarily disable the feedback between the cross-coupled NOR gates to assist the latches to receive a different state. The second slave latch output is fed via lines 316 and 317 to complementary outputs APEi and APEib.

Feedback of the second slave latch circuit along complementary feedback lines 318 and 319 to the first master latch circuit is controlled by an input signal JIN that selects by means of pass gate elements 320 and 321 between the complementary feedbacks. The input signal JIN is obtained from program and erase counter outputs APEi of lower bit significance. On each clock, the least significant bit changes between 0 and 1, while all other bits only change state when all of the bits of lower significance are 1's. Thus, when used as an erase counter, the program and erase counter/register 36 starts at the address designated by the input bits ADi and count upward by one on each clock. When used as a program address register, the JIN signal is set for all register bits so that the latches always retain their initial state loaded from address inputs ADi.

In FIG. 6, the erase-suspend program register gates the address input bits ADi through a pass gate element 401 controlled by a register lock signal ASP_REGL. The address input bit ADi is latched by cross-coupled NAND gate 403 and inverter 404. A second NAND gate input receives a signal ESUSTM that (when active) sets the latch state high. The suspend register has complementary address bit outputs ASPi and ASPbi supplied from the latch output node 405.

Returning to FIG. 2, the outputs ADi, ACi, APEi, and ASPi (and their complements) of functional registers 34–37 are fed into an array 26 of N plane selector blocks for operation in one of the N different planes (memory banks) which are controlled by plane address bits APLAi. Each plane selector block receives the outputs from all of the functional registers as inputs to be selected. The plane function select control logic 32, responsive to the plane decoder 28 and command decoder 30, routes, the address bits from the selected counter/register to the appropriate planes along with the appropriate command signals, using selection control inputs 47. For example, if burst read operation is on plane A, while an erase operation is on plane B, then burst read counter/register 35 outputs ACi are gated through plane A selector block 40 to its outputs PLA_A, while program and erase counter/register 36 outputs APEi are gated through plane B selector block 41 to its outputs PLA_B.

FIG. 7 shows one-bit of a preferred plane selector block (any of 40, 41, . . . , 43) for selecting from the various functional register outputs. Register output bits ADi, ACi, APEi and ASPi are received as inputs and are gated by respective pass gate elements 501–504 that are controlled by respective command signals CHPTSMn, RDPLNn, PGM_ERSn, and SUSPLn for plane n. These command signals are provided by the plane function select control logic 32 in FIG. 2 in accord with the decoded command for plane N. The pass gate outputs are all tied to a single plane n bit output PLAni. The output could be forced to zero by a signal PLAL0.

Returning to FIG. 2, each plane has its own set of decoder logic 50, 51, . . . , 53 (both XP/XD and Y decode) coming from the sets of plane selector outputs, PLA_A, PLA_B, . . . , PLA_N. This decoding system takes the command and address from the inputs, then assigns the specific operation to a designated sector 60 in a plane of the memory array. Each plane's decoder logic operates independently to complete its own task of read, write or erase without interference from one another. In this way, read and program and erase can operate on different planes simultaneously. Each plane might be equipped with 128 sense amplifiers (SA) and their corresponding registers and O-line control, which would enable the data reading out from the plane or high voltage going in. This bidirectional control also operates independently for each plane.

This multi-plane functional register decode system not only supports random read operations, but also burst read operations. It not only supports a burst read in one plane while writing or erasing in another plane, but also a temporary pause of erasure in one sector in order to read (either random or burst) or write in another sector of the same plane. More importantly, it can temporarily stop the writing in a sector to access data at another address in the same plane, while erasure is paused in another sector of the same plane. After the read operation finishes, writing in the sector can finish correctly. The erasure can also continue at the point of the temporary stop after the program operation finishes. This data access during writing and erasure can repeat numerous times without hindering the successful completion of writing or erasing operations.

When a specific functional operation is detected, the command decoder 30 will issue a load command to the particular counter/register 34–37 which is responsible for that function. Once the counter/register is loaded, it will be locked until that particular function is finished. Meanwhile, the plane function select control logic 32 will combine the signals from the command decoder 30 and the plane decoder 28 and issue a select command on select control bus 47 to the plane selector 26. The plane selector block 40, 41, . . . , 43 for the corresponding plane will select the address signals ADi, ACi, APEi or ASPi from the particular functional counter/register 34–37 and output it to that plane.

Whenever another operating command of a different type comes in while the first operation is still going on in one plane, the command decoder will load the address to another counter/register that corresponds to that type of operation. Note, however, that no two same functions will be operated simultaneously. Since the first functional counter/register is locked, its operational address will not be overridden by the new input addresses, to allow the first operation to be completed smoothly without interruption before accepting another operation of the same type.

The following two examples illustrate how the system works.

EXAMPLE 1

Burst Read in Plane A, while Erase a Sector in Plane B

When an erase command is detected by the command decoder, a load signal will be issued to load the sector address in plane B into the program and erase counter/register. This register will be locked after loading. Now the counter/register will generate all the addresses needed in the various cycles of the erase operation.

During this time, if the user needs to read a block of data from plane A, the initial address of the block will be loaded into the burst read counter/register, without any disruption of the erasing cycle because the counter/register for erasure is locked. The bursting address for plane A is counted by the burst read counter/register.

Since addresses in two operations are handled by two separate counters/registers, the two operations can perform simultaneously without interference with each other.

EXAMPLE 2

Burst Read in Sector 1 of Plane N, while Program Suspend in Sector 2 of Plane N and a Nesting Erase Suspend in Sector 3 of Plane N First, the user wants to erase sector 3 in plane N. All the address needed for the operation is handled by the program and erase counter/register.

Then, the user needs to write some data into sector 2 of plane N. Since this is a same plane operation, the erase operation has to stop temporarily to avoid bitline contention. Counting in the program and erase counter/register must stop and the current address must be maintained. In this case, the program address for sector 2 cannot be loaded into the program and erase counter/register, but to the suspend program register. The programming cycle can last for microseconds.

During this time, if the user has the urgency to read a block of data from sector 1 of plane N, then the programming operation must stop temporarily also, but its address must be maintained for the programming operation to finish after the data reading has been completed. In this case, the suspend program register will be locked. The plane selector will select address signals from the burst read counter/register to plane N.

After the read operation completes, program operation will continue and the sector 2 address will be gated to plane N by the plane selector.

After programming operation completes, the erasing operation in sector 3 will be able to continue at the address locked in the program and erase counter/register without any error.

This functional register decoding system allows different functions operated in different planes without bus contention. Furthermore, it also allows nesting suspension of erase-program for data bursting in the same plane, then has the program and erase operations continue to finish correctly after the read.

What is claimed is:

1. In a multiple plane memory having a common address space and capable of multiple types of memory access operations, each memory plane having independent address decoding logic dedicated to the address space for that plane, a functional register decoding system for routing of command and address information to designated planes, the decoding system comprising:
   a plurality of functional registers dedicated to distinct memory access operations, each register configured to receive an input address, and to provide at least one address output in accord with its dedicated memory access operation;
   a plurality of plane selector blocks, each plane selector block dedicated to a distinct one of the memory planes, each plane selector block configured to receive as inputs the address outputs from all of the plurality of functional registers, the plane selector blocks routing a selected one of its inputs as an output to its dedicated plane in accord with a control signal input; and
   plane function select means configured to receive decoded plane and command information for providing control signals to the plurality of plane selector blocks in accord with the decoded information such that command information for a particular memory access operation and plane information for a particular one of the memory planes are used to route address outputs from the functional register dedicated to that memory access operation to that particular memory plane.

2. A functional register decoding system as in claim 1, wherein the plurality of functional registers include address registers dedicated to any two or more of the memory access operations comprising random access read, burst read, program, erase, and erase-suspend program operations.

3. A functional register decoding system as in claim 2 wherein registers dedicated to burst read and erase operations are counter registers.

4. A functional register decoding system as in claim 2 wherein program and erase operations share a single register dedicated to both types of memory access operation.

5. A functional register decoding system as in claim 1 wherein each register includes a register lock responsive to a lock control signal for selectively enabling or disabling loading of an input address into the register.

6. A functional register decoding system as in claim 1 wherein the plane function select means supports simultaneous operations of different types within different planes, the plane function select means providing control signals to a first plane selector block for routing address outputs from one functional register to a first plane and providing further control signals to a second plane selector block for routing address outputs from a different functional register to a second plane.

7. A functional register decoding system as in claim 1 wherein the plane function select means supports nested operations within a single plane, the plane function select means providing control signals to a plane selector block corresponding to a plane that suspends a first memory access operation in order to carry out a second memory access operation of a different type, then resumes the first memory access operation.

8. A functional register decoding system as in claim 7 wherein the nested operations include an program or erase operation and a read operation.

9. A functional register decoding system as in claim 8 wherein the read operation is a burst read operation.

10. A functional register decoding system as in claim 7 wherein the nested operations include an erase operation and a program operation, the erase and program operations normally sharing a single functional register, the functional registers including a erase-suspend program register for storing an input address corresponding to the nested program operation while the erase operation is suspended.

11. A method of maintaining address information for a plurality of types of memory access operations in a multiple plane memory, each operation destined for execution in a particular one of the memory planes, the method comprising:
   (a) receiving address and command information corresponding to a particular memory access operation at an address in a particular memory plane;
   (b) storing the address information in a functional register dedicated to the particular memory access operation, the functional register being locked until the operation specified for the address information is completed;
   (c) routing the address information from the functional register to the particular memory plane;
   (d) repeating steps (a) through (c) for successive received address and command information, except that registers are inaccessible to receiving new address information while locked.

12. A method as in claim 11 wherein the memory access operations having a corresponding dedicated functional register include any two or more of random access read, burst read, program, erase, and suspend-erase program.

13. A method as in claim 11 wherein the repeating step (d) includes simultaneous memory access operations of different types being executed in different memory planes, each operation having address information routed from its corresponding functional register to the memory plane specified for that operation.

14. A method as in claim 11 wherein the repeating step (d) includes nested memory access operations of different types being executed in the same memory plane, the nested memory access operation comprising (1) suspending of a first memory access operation, (2) carrying out of a second memory access operation while the first operation is suspended, and (3) resuming the first memory access operation when the second operation has been completed, each operation having address information routed successively from its corresponding functional register to the specified memory plane, address information in the functional register corresponding to the first memory access operation being maintained while the second operation is carried out so as to be available for when the first operation is subsequently resumed.

15. A method as in claim 14 wherein the nested operations include an program or erase operation and a read operation.

16. A method as in claim 15 wherein the read operation is a burst read operation.

17. A method as in claim 14 wherein the nested operations include an erase operation and a program operation, the erase and program operations normally sharing a single functional register, the functional registers including a erase-suspend program register for storing a address information corresponding to the nested program operation for execution while the erase operation is suspended.

\* \* \* \* \*